United States Patent [19]

Schlegel et al.

[11] 4,238,761
[45] Dec. 9, 1980

[54] INTEGRATED GATE ASSISTED TURN-OFF, AMPLIFYING GATE THYRISTOR WITH NARROW LIPPED TURN-OFF DIODE

[75] Inventors: Earl S. Schlegel, Pittsburgh; Derrick J. Page, Export, both of Pa.

[73] Assignee: Westinghouse Electric Corp., Pittsburgh, Pa.

[21] Appl. No.: 581,255

[22] Filed: May 27, 1975

[51] Int. Cl.³ .................................. H01L 29/47
[52] U.S. Cl. .................................. 357/38; 357/20; 357/65; 357/86; 357/91
[58] Field of Search ................ 357/20, 38, 39, 65, 357/86, 91

[56] References Cited

U.S. PATENT DOCUMENTS

| | | | |
|---|---|---|---|
| 3,442,722 | 5/1969 | Bäuerlein et al. | 357/38 |
| 3,487,276 | 12/1969 | Wolley | 357/38 |
| 3,549,961 | 12/1970 | Gault | 357/39 |
| 3,579,060 | 5/1971 | Davis | 357/38 |
| 3,586,927 | 6/1971 | Roach et al. | 357/38 |
| 3,586,932 | 6/1971 | Kokosa | 357/39 |
| 3,590,346 | 6/1971 | Bilo et al. | 357/38 |
| 3,611,066 | 10/1971 | Knaus | 357/38 |
| 3,681,667 | 8/1972 | Kokosa | 357/39 |
| 3,832,732 | 8/1974 | Roberts | 357/38 |
| 3,858,236 | 12/1974 | Schafer | 357/38 |
| 3,881,964 | 5/1975 | Cresswell et al. | 357/38 |
| 3,896,476 | 7/1975 | Kawakami | 357/38 |
| 3,967,294 | 6/1976 | Takase et al. | 357/38 |

OTHER PUBLICATIONS

E. Wolley et al., "Char. of a 200 AMP Gate Turn-Off Thyristor," IEEE Conf. Rec. of IAS, 73 CHO 763-31A, Oct. 8-11, 1973, pp. 251-255.

Primary Examiner—Joseph E. Clawson, Jr.
Attorney, Agent, or Firm—C. L. Menzemer

[57] ABSTRACT

An integrated amplifying gate thyristor is provided with an integral diode in the thyristor structure in the same semiconductor body. The diode provides gate assist turn-off capability with the same gate electrode used to turn-on a pilot thyristor of the device. The common cathode-base region of the pilot and main thyristors also is common with the anode region of the diode. The current gain of the NPN transistor structure formed at the diode and the common anode-base region at the diode is less than the ratio of $I_{FB}/I_g$, where $I_{FB}$ is the forward anode current on triggering the main thyristor into the low impedance conduction state by applying a threshold negative gate assist current ($I_G$) and an operating anode-cathode load potential, and $I_g$ is a negative gate current selected to assist in turn-off of the main thyristor. Preferably, the current gain of said NPN transistor structure at the diode is controlled by selectively irradiating the diode preferably with electron radiation, by adding a shallow impurity lip to the cathode region of the diode toward the main thyristor, or both.

2 Claims, 8 Drawing Figures

INTEGRATED GATE ASSISTED TURN-OFF, AMPLIFYING GATE THYRISTOR WITH NARROW LIPPED TURN-OFF DIODE

FIELD OF THE INVENTION

The present invention relates to semiconductor devices and particularly amplifying gate thyristors having gate assisted turn-off capability.

BACKGROUND OF THE INVENTION

Thyristors are nonlinear, solid state devices that are bistable. That is, they have both a high impedance state and a low impedance state. For this reason, thyristors are generally used as solid state switches. Thyristors commonly have four-layer PNPN semiconductor structures, with two intermediate regions called cathode-base and anode-base regions, and two extremity regions adjoining major surfaces of a semiconductor body called cathode-emitter and anode-emitter regions. Thyristors are usually gated or switched from a high impedance blocking state to a low impedance conducting state by applying through a gate electrode a positive electrical control signal to the cathode-base region of the device.

In operation, a positive control signal forward biases the PNP junction (cathode junction) between the cathode-emitter and cathode-base regions and causes electron injection into the cathode-base region in the vicinity of the reverse biased, forward blocking center PN junction between the cathode-base and anode-base regions. The injected electrons are swept across the depletion layer at the forward blocking junction, causing an anode-to-cathode electric current and increasing the current gain ($\alpha$'s) of the PNP and NPN transistor equivalents of the structure. If the positive control signal is high enough, the sum of the gains ($\alpha$s) of the NPN and PNP structure equal unity in some portion or filament, and the device will switch the thyristor from the high impedance, blocking state to the low impedance, conducting state. The thyristor will thereafter remain in the conducting state so long as the current through the thyristor exceeds the holding current of the device.

A major restriction on power thyristors has been the dI/dt capability, i.e. the rate of current increase or "turn-on" as a function of time. The difficulty is that only a small portion of the device is responsive to the control signal and initially switches to the conducting state. The device is dependent upon carrier diffusion to turn-on the remainder of the active regions, which diffusion requires substantial time. Initially, on turn-on, the anode-to-cathode voltage drops instantaneously to about 10% of the blocking state value, and the current is conducted through the portions or filaments of the device in the conducting state, causing a very high current density and localized heating and degrading of the device. To avoid such degradation and possible failure of the thyristor, the external circuit typically requires an inductance to limit the current rise on switching of the thyristor, which causes power losses and generally limits the performance of the circuit.

Figure 1:
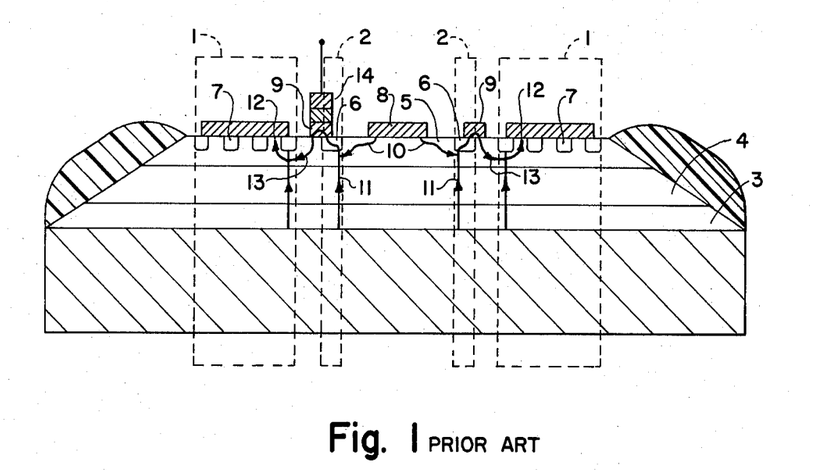
FIG. 1 is a cross-sectional view in elevation of a prior art amplifying gate thyristor with gate assist turn-off capability.

Amplifying gate thyristors, such as the one shown in FIG. 1, have been developed to provide improved dI/dt capability in power thyristors and to reduce the current carrying requirements of the gate circuit. An auxiliary or pilot thyristor 2 of annular shape is provided preferably centrally of the main thyristor 1 in the same semiconductor body. Pilot thyristor 2 and main thyristor 1 have their anode-emitter, anode-base and cathode-base regions 3, 4 and 5 in common, and the cathode-emitter regions 6 and 7 of the pilot and main thyristors are spaced adjacent each other along the same major surface of the semiconductor body. A gate electrode 8 is provided adjacent and preferably centrally of the pilot thyristor opposite from the main thyristor, and a floating electrode 9 is provided on the major surface of the semiconductor body astride the PN junction between the cathode-emitter and cathode-base regions of pilot thyristor 2.

Pilot thyristor 2 is turned-on by a control signal applied to gate electrode 8 which flows laterally into pilot thyristor 2 as shown by arrows 10, formed biasing the cathode junction between the cathode-emitter and cathode-base regions 5 and 6, and turning-on the pilot thyristor 2 from the inner edge of the cathode-emitter where the gate current is injected. The resulting anode current as shown by arrows 11 through the pilot thyristor 2 is utilized as a gate current to turn-on main thyristor 1. The anode current from pilot thyristor 2 flows through floating contact 9 and cathode-base region 5 to the cathode shunts 12 along the inner edge of cathode-emitter region 7 of main thyristor 1 as shown by arrows 13. A substantial portion of the main thyristor, particularly if the structure is interdigitated, can thus be initially switched to the conducting state. Such amplifying thyristors can be utilized to rapidly switch high power without substantial power losses. Cathode shunts 12 also provide increased dv/dt capability by conducting anode current without forward biasing the cathode junction and producing a lateral current flow that more rapidly forward biases the cathode junction.

Thyristors are also notorious for their long turn-off times. That is, the time required to establish the high impedance, blocking state in the thyristor on switching from the low impedance, conducting state. In a simple thyristor structure, the blocking state can be restored only by reducing the anode-to-cathode current to below the holding current for such a time period to allow the depletion layer to be reformed at the forward blocking center junction when forward voltage is reapplied. The turn-off time is thus directly related to the diffusion time of the carriers, both electrons and holes, across the base regions and to the carrier lifetimes within the base regions.

Where rapid turn-off capability has been needed, an interdigitated gate electrode structure has been provided with the cathode-emitter region and cathode electrode. A negative control signal is applied to the interdigitated gate electrode(s) to cause a current flow from the cathode electrode and reverse bias the cathode junction between the cathode-base and cathode-emitter regions. The current density in the device can thus be counteracted after rapid reduction of the load current to zero to avoid refiring of the device by rapid reapplication of the load potential, e.g. in high frequency operation of 10 to 20 KHz. Or, the high impedance blocking state can thus be reestablished in the thyristor while a load current is still applied to the device under low frequency or DC load potentials. Thyristors operated in the former mode are commonly called "Gate Assisted Turn-Off Thyristors" or "GATTs"; and thyristors operated in the latter mode are commonly called "Gate Controlled Switches" or "GCSs".

Gate assisted turn-offs cannot be effectively performed in thyristors with amplifying gates for turn-on unless separate gates are utilized for turn-on and turn-off. Presently known amplifying gate designs have a high lateral resistance (e.g. 10–25 ohms) in the direction in which current must flow during turn-off. The current for turn-off is of opposite polarity from the gate current for turn-on, and the cathode junction between the cathode-emitter and cathode-base of the pilot thyristor is reverse biased. The current must, therefore, flow laterally through cathode-base region 5 under cathode-emitter region 6 to reach gate electrode 8. The resulting high resistance will, for a given gate voltage, greatly reduce the gate turn-off current and in turn reduce the effectiveness of the gate assist turn-off. In addition, degradation of the device may occur due to nonuniform avalanche of the cathode junction between the cathode-emitter and cathode-base regions of the pilot thyristor 2. For this reason, thyristor designers have avoided the use of amplifying gate devices where a gate assisted turn-off is required.

Gate assisted turn-off capability has been provided in amplifying gate thyristors by providing a separate turn-off gate through which the anode current from the main thyristor may be shunted without passing through the pilot thyristor. A diode 14 is provided to block current flow through said separate gate during turn-on. Diode 14 is typically fused to floating electrode as shown in FIG. 1, which doubles as the turn-off gate.

These separate, rectified turn-off gates are difficult and expensive to fabricate and package. Moreover, such rectified turn-off gate has not been heretofore successfully provided integral with the thyristor structure in the same semiconductor body. The difficulty is that the forward biasing of the PN junction of the diode causes an anode current, impairing the effectiveness of the gate assist turn-off.

The present invention overcomes these difficulties of prior devices. An amplifying gate thyristor is provided with an integral diode in the thyristor structure in the same semiconductor body. Moreover, the amplifying gate thyristor is capable of performing gate assisted turn-offs through the same gate electrode used to turn-on the pilot thyristor.

SUMMARY OF THE INVENTION

An integrated amplifying gate thyristor with gate assist turn-off capability is comprised of main and pilot thyristors disposed in a semiconductor body having first and second major surfaces. Each thyristor has four impurity regions, three of which are common to the other thyristor, extending through the body between the major surfaces. The impurity regions of each thyristor are of alternate conductivity-type disposed alternately through the body, with PN junctions formed between adjacent impurity regions. The two impurity regions adjoining the first and second major surfaces are cathode-emitter and anode-emitter regions, respectively; and the two impurity regions interior of the body adjoining the cathode-emitter and anode-emitter regions are cathode-base and anode-base regions.

The cathode-base, anode-base and anode-emitter regions are common to both thyristors. The common cathode-base region adjoins the first major surface of the semiconductor body at least between the thyristors; and the cathode-emitter regions of the main and pilot thyristors are adjacent to and spaced apart from each other along the first major surface. Preferably, the pilot thyristor is positioned centrally of the main thyristor, the cathode-emitter region of the pilot thyristor is formed in annular segments, and the main thyristor provided with cathode shunts.

A diode to provide for gate assist turn-off capability is disposed in the semiconductor body integrally with the thyristor structure. The diode has anode and cathode impurity regions, with the anode region common with the cathode-base region of the thyristors. The cathode region is a separate impurity region disposed in the semiconductor body adjoining the first major surface adjacent to and spaced from the cathode-emitter regions of both the main and pilot thyristors, and is of an impurity of a conductivity type to form a separate PN junction with the common cathode-base region of the thyristors.

The current gain of the transistor structure formed by the diode and the common anode-base region at the diode is less than the ratio of $I_{FB}/I_g$, where $I_{FB}$ is the forward anode current on triggering the main thyristor into the low impedance conduction state by applying a threshold negative gate assist current $(I_G)$ and an operating anode-cathode load potential, and $I_g$ is a selected gate assist turn-off current to turn-off the main thyristor. Said current gain is preferably established by localized control of the carrier lifetime in the common cathode-base region at the diode, which may be done in any suitable way. The width and impurity concentration of the common cathode-base region at the diode may be locally varied to lower the transport factor for electrons through that region. The impurity concentration of the cathode region of the diode and the common cathode-base region at the diode can be controlled to reduce the injection efficiency for electrons into the cathode-base region at the diode.

Preferably, however, the current gain is controlled by decreasing the carrier lifetime in the common cathode-base region at the diode. That may be accomplished by selective diffusion of gold into the common cathode-base region at the diode. Preferably, the carrier recombination rate is increased without correspondingly increasing the carrier regeneration rate by selectively irradiating the diode most desirably by electron radiation, preferably of energy between 1 and 3 Mev, and preferably to a dosage level greater than $1 \times 10^{13}$ electrons/cm². Additionally, a shallow impurity lip of preferably greater than the area and less than one-half of the depth of the deep portion is added to the cathode region of the diode toward the cathode-emitter region of the main thyristor to reduce the current gain of the NPN structure at the diode at the part where injection occurs on the gate assisted turn-off. This shallow impurity lip also allows for increased depth of the deep portion of the cathode region (without a corresponding increase in current gain) to provide a high lateral resistance in the common cathode-base region at the diode and avoid the waste of gate current on turn-on.

The thyristor is completed by positioning electrodes on the major surfaces of the semiconductor body. Cathode and anode electrodes are positioned on said first and second major surfaces, respectively, to make preferably low resistance, ohmic contact with the cathode-emitter region of the main thyristor and with the common anode-emitter region of the main and pilot thyristors. A gate electrode is positioned on the first major surface to make preferably low resistance, ohmic contact with the common cathode-base region adjacent to and spaced from the cathode-emitter region of the pilot thyristor, and with the cathode region of the diode. A floating electrode is positioned on the first major surface adjacent to and spaced from the gate electrode to make preferably low resistance, ohmic contact with the common cathode-base region between the thyristors and the cathode-emitter region of the pilot thyristor. Preferably, the floating electrode is also interedigitated with the cathode-emitter region of the main thyristor without making ohmic contact with said cathode-emitter region.

Preferably the pilot thyristor is positioned centrally of the main thyristor. The cathode-emitter region of the pilot thyristor and the cathode region of the diode are preferably formed in spaced apart annular segments. The annular segments of the cathode-emitter region of the pilot thyristor may also be offset from the annular segments of the cathode region of the diode to facilitate alignment of an irradiation mask and in turn selective irradiation of the diode to reduce the current gain of said NPN transistor structure at the diode.

Other details, objects and advantages of the invention will become apparent as the following description of the presently preferred embodiments and presently preferred methods of performing the same proceeds.

BRIEF DESCRIPTION OF THE DRAWINGS

In the accompanying drawings, the presently preferred embodiments of the invention and presently preferred methods of performing the invention are illustrated, in which.

DESCRIPTION OF THE PREFERRED EMBODIMENTS

Referring to FIG. 1, a prior art amplifying gate thyristor with gate assist turn-off capability is shown for purposes of comparative illustration. Discussion of this prior art device can be found in the "Background of the Invention".

Figure 2:
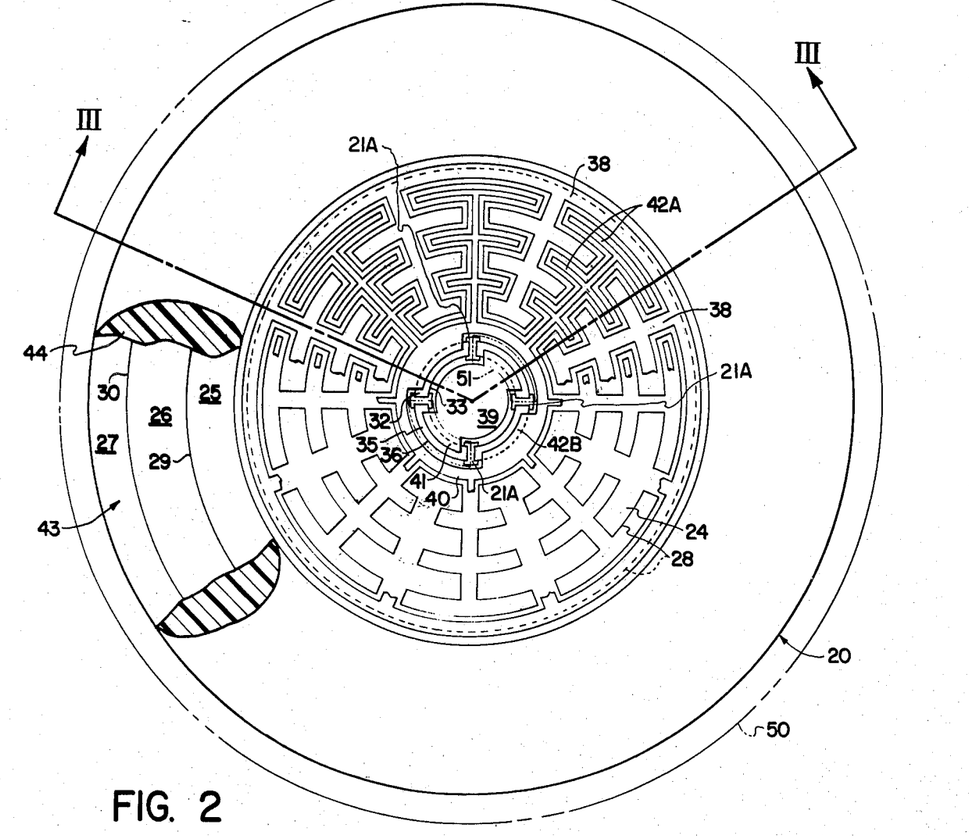
FIG. 2 is a partial top view, with portions broken away and a suitable irradiation mask shown in chain line, of integrated amplifying gate thyristor with gate assist turn-off capability of the present invention.
Figure 3:
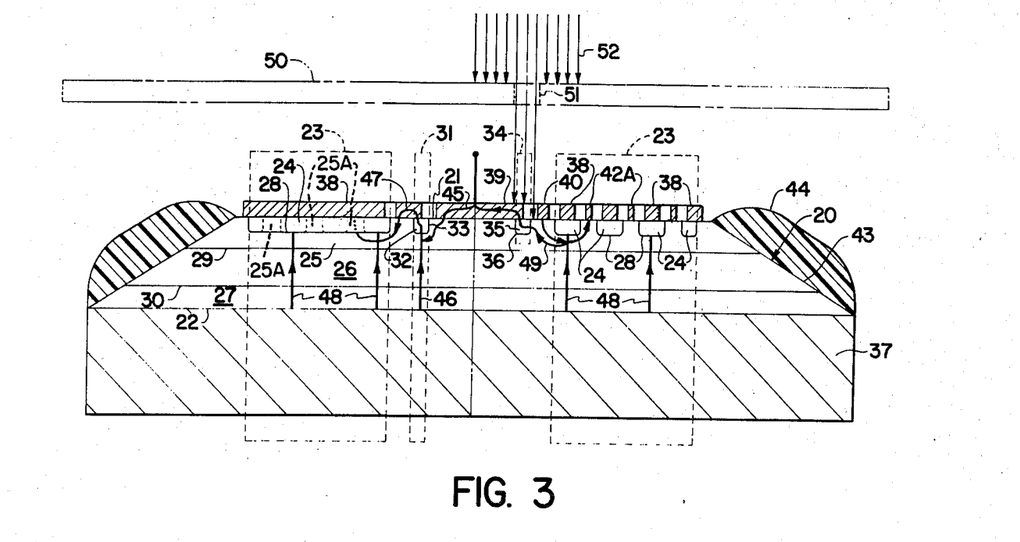
FIG. 3 is a cross-sectional view in elevation taken along lines III—III of FIG. 2.

Referring to FIGS. 2 and 3, semiconductor body 20 is provided for forming an integrated amplifying gate thyristor with gate assist turn-off capability of the present invention. Semiconductor body 20 is typically a commercially available single crystal silicon wafer of circular shape having a thickness typically of about 8 to 20 mils, and having first and second opposed major surfaces 21 and 22.

Provided in semiconductor body 20 are suitable impurities, typically in a pattern having circular symmetry, to form a main thyristor 23 of four impurity regions 24, 25, 26 and 27 of alternate type conductivity disposed alternately through the body 20 from first major surface 21 to second major surface 22. PN junctions 28, 29 and 30 (cathode, forward blocking and anode junctions, respectively), are thus formed between impurity regions 24 and 25, 25 and 26, and 27 and 28, respectively. Impurity regions 24 and 27 adjoin first and second major surfaces 21 and 22, respectively, to form cathode-emitter region 24 and anode-emitter region 27 of main thyristor 23; and impurity regions 25 and 26 are disposed in body 20 adjoining cathode-emitter and anode-emitter regions 24 and 27 to form cathode-base region 25 and anode-base region 26 of main thyristor 23. Impurity region 25 also adjoins first major surface 22 centrally and peripherally around cathode-emitter region 24, and preferably intermittently cathode-emitter region 24 to form cathode shunts 25A.

Impurities are also provided in semiconductor body 20 to form a pilot thyristor 31 with cathode-base, anode-base and anode-emitter regions common to main thyristor 23. At least one additional impurity region 32 is provided adjoining first major surface 21 adjacent to and spaced preferably centrally from cathode-emitter region 24 of main thyristor 23. Impurity region 32 is of a conductivity type to form PN junction 33 with said common cathode-base region 25 and form separate cathode-emitter region 32 for pilot thyristor 31.

Also provided in semiconductor body 20 is an impurity to form diode 34 having its anode region common with common cathode-base region 25 of thyristors 23 and 31. Diode 34 has its cathode region formed by an impurity region 35 adjacent to and spaced from cathode-emitter regions 24 and 32 of main and pilot thyristors 23 and 31. Impurity region 35 is of a conductivity type to form PN junction 36 with common cathode-base region 25 of the thyristors.

Preferably, pilot thyristor 31 is positioned centrally of main thyristor 23, as shown in FIGS. 2 and 3, to provide for most efficient utilization of the anode current through pilot thyristor 31 to turn-on main thyristor 23. In addition, cathode-emitter region 32 of pilot thyristor 31 and cathode region 35 of diode 34 are typically formed in spaced apart annular segments, for example, as illustrated in FIGS. 2 and 3, to most easily fabricate the structure.

Typically, the impurities and impurity regions as above described are provided in the semiconductor body 20 by standard diffusion techniques. Alternatively, the impurity regions may be provided by expitaxial growth or a combination of expitaxial growth and diffusion.

To illustrate, the impurities and impurity regions are typically provided by commercially obtaining semiconductor body 20 uniformly doped with an N-type impurity, such as phosphorus or arsenic, to a concentration typically between about $5 \times 10^{13}$ and $5 \times 10^{14}$ atoms/cm², i.e. 200 to 10 ohm-cm. Body 20 is typically diffusion doped with a P-type impurity such as boron, gallium or aluminum through first and second major surfaces 21 and 22 by standard diffusion techniques to form cathode-base and anode-emitter regions 25 and 27. Anode-base region 26 is formed at the same time between regions 25 and 27 by the residual N-type impurity of the body. Anode-base region 26 typically has a thickness between about 150 and 250 microns, depending upon the desired voltage rating of the device. Cathode-base and anode-emitter regions 25 and 27 have surface impurity concentrations of typically between about $5 \times 10^{15}$ and $1 \times 10^{18}$ atoms/cm$^3$. If desired, to reduce the resistance of anode-emitter region 27 and lower the forward voltage drop of the device in the conduction mode, first major surface 21 may be masked and the diffusion continued to raise the impurity concentration of anode-emitter region 27 adjacent second major surface 22 to at least $1 \times 10^{18}$ atoms/cm$^3$.

After the initial diffusion, first and second major surfaces 21 and 22 are masked with a standard diffusion mask such as silicon dioxide. Typically this masking is accomplished by heating semiconductor body 20 in an oxygen rich atmosphere such as steam to about 1200°–1250° C. for three to four hours. Window patterns suitable for simultaneously forming cathode-emitter regions 24 and 32 of main and pilot thyristors 23 and 31, respectively, and cathode region 35 of diode 34 are then opened in the masking layer covering first major surface 21 by standard photolithographic and etch techniques. Impurity regions 24, 32, and 35 are then simultaneously provided into semiconductor body 20 through the opened window pattern and exposed portions of first major surface 21 by diffusion of an N-type impurity such as phosphorus by a standard diffusion method. Cathode-emitter regions 24 and 32 and cathode region 35 are thus formed adjoining first major surface 21 adjacent to and spaced apart from each other with a surface concentration typically of about $1 \times 10^{19}$ to $1 \times 10^{21}$ atoms/cm$^3$ and a diffusion depth typically of about 10 to 20 microns.

The current gain of the NPN transistor structure formed by cathode region 35 of diode 34, and common cathode-base and anode-base regions 25 and 26 at diode 34 is provided less than the ratio of $I_{FB}/I_g$, where $I_{FB}$ is the forward anode current on triggering of the main thyristor into the low impedance conducting state by applying a threshold negative gate assist current ($I_G$) and an operating anode-cathode load potential, and $I_g$ is a selected gate assist turn-off current to turn-off main thyristor 23. The current gain ($\alpha$) is calculated by dividing the forward anode current ($I_{FB}$) by the threshold negative gate assist current ($I_G$) measured in the same way. The "threshold" negative gate assist current is the minimum negative gate assist current to trigger the main thyristor under the operating anode-to-cathode load potential. This "operating" load potential will, of course, vary with whether the thyristor is operated in the GATT or GCS mode. In either case, the operating load potential is at the highest voltage and highest rate of change of voltage at which the thyristor is designed to operate. All determinations are also made at the highest temperature at which the thyristor is designed to operate. In this connection, it should be noted that some anode current is associated with the function of the diode when the thyristor is in a high impedance blocking state.

Maintaining the current gain of the NPN structure below said ratio enables the main thyristor to be turned-off by gate assist through forward bias of PN junction 36 of diode 34 without causing the main thyristor to retrigger into the conduction mode. The negative gate assist bias can thus be efficiently utilized to assist in the turn-off of the main thyristor as hereinafter more fully described. To understand the reason for maintaining said current gain below said ratio, consider what would happen if the current gain were not below said ratio: when the negative gate assist is applied, the current is drawn out of the device through the gate electrode and electrons are injected into common cathode-base region 25 through junction 36. Many of these electrons reach forward blocking junction 29 and flow through into anode-base region 26. These electrons are base current to the PNP transistor structure formed by the cathode-base, anode-base and anode-emitter regions 25, 26 and 27 and cause emitter-to-collector current. The impedance of the circuit of main thyristor 23, which is typically designed to conduct several hundred amperes, is lower than the gate circuit, which is typically designed to carry a few amperes. Accordingly, the anode-to-cathode load potential drives said emitter-to-collector current of the PNP transistor structure primarily into the common cathode-base region 25 at the main thyristor, forward biasing cathode junction 28 and triggering main thyristor 23. The main thyristor is prevented from triggering in this manner in the present invention by maintaining the current gain of the NPN transistor structure at the diode low and minimizing the gate-assist-current-induced electrons reaching forward blocking junction 29.

The current gain of the transistor structure formed by cathode regions 35 of diode 34 and common cathode-base and anode-base regions 25 and 26 at diode 31 is controlled by tailoring the geometry and injection efficiency of cathode region 35, the width and impurity distribution of common cathode-base region 25 at diode 31, and the carrier recombination rate in common cathode-base region 25 at diode 31. The parameters may be controlled in any suitable way including separately diffusing impurity region 35 to vary its depth and impurity concentration. Preferably, however, cathode region 35 is simultaneously diffused with impurity regions 24 and 32, and the carrier recombination rate of common cathode-base region 25 at diode 34 varied to provide the desired localized current gain. Said carrier recombination rate may be established in any desired way such as by selective diffusion of gold to provide recombination centers. Gold diffusion is, however, not preferred because of adding masking and diffusion steps, the difficulty in controlling the diffusion depth, and the leakage current which results. Most desirably, the carrier recombination rate in common cathode-base region 25 at diode 34 is tailored by selective irradiation of diode 34 as more fully described hereinafter in connection with FIGS. 4 and 5.

Preferably, at this stage in the fabrication, portions 21A of first major surface 11 between cathode-emitter region 32 and cathode region 35 are selectively etched by standard photolithographic masking and etching techniques. This etch removes the highly conductive (diffusion) layer in those areas. The current conductivity in those areas is reduced and the amount of wasted current in both the turn-on and turn-off modes is reduced by preventing gate current from flowing through common cathode-base region 25 between the segments of cathode-emitter region 32 of pilot thyristor 31 and cathode region 35 of diode 34.

After completion of diffusions and preferred selective etch, semiconductor body 20 is disposed on anode electrode 37 with second major surface 22 of the body in contact with the major surface of the electrode. Electrode 37 is usually separately formed of molybdenum or tungsten in a circular shape at least as large in diameter as semiconductor body 20 and is generally 50 to 80 mils thick. Electrode 37 is thereafter alloyed to second major surface 22 of the semiconductor body by heating electrode 37 and body 20 in intimate contact in an inert atmosphere such as argon to a temperature typically of about 680° C., or by some other known method to produce ohmic contact thereto. Electrode 37 makes preferably low resistance, ohmic contact with common anode-emitter region 37 across the entire second major surface 22.

Cathode-electrode 38, gate e electrode 39 and floating electrode 40 are then preferably simultaneously formed on first major surface 21. Cathode-electrode 38 makes preferably low resistance, ohmic contact with cathode-emitter region 24 of main thyristor 23 and is preferably a patterned electrode in the form of a "snowflake" design to provide for gate interdigitation. Cathode-electrode 38 also makes ohmic contact with common cathode-base region 25 at cathode shunts 25A and at the periphery to assist in providing high dv/dt capability. Gate electrode 39 is typically generally circular with radially extending portions 41 as shown in FIG. 2, to make preferably low resistance, ohmic contact with the common cathode-base region 25 adjacent to and spaced from cathode-emitter region 32 of pilot thyristor 31, and with cathode region 35 of diode 34. Floating electrode 40 is typically an interdigitated structure with radially extending portions 42A interdigitated with cathode electrode 38, and makes low resistance, ohmic contact with common cathode-base region 25 between segments of main thyristor 23, and radially extending portions 42B to make preferably low resistance, ohmic contact with common cathode-base region 25 between main and pilot thyristors 23 and 31 and cathode-emitter region 32 of pilot thyristor 31.

Electrodes 38, 39 and 40 may be of any suitable metal, such as aluminum, which will provide an ohmic contact and preferably a low resistance, ohmic contact to the semiconductor body. Preferably, the material for the electrodes is also one, such as aluminum, which can be readily vapor or sputter deposited on the semiconductor body. Preferably, electrodes 38, 39 and 40 are vapor or sputter deposited to a thickness typically of about 50,000 to 100,000 Å. Electrodes 38, 39 and 40 are selectively formed as above described and shown in FIG. 2 by deposition over the entire surface followed by selected removal of the deposited layer by standard photolithographic masking and etching techniques. As formed, electrodes 38, 39 and 40 typically make low resistance ohmic contact as above described; however, sintering to achieve the lower resistance of the contact may be appropriate in certain embodiments.

The integrated amplifying gate thyristor is typically completed by lapping side surfaces 43 by known procedures to bevel said side surfaces and shape the electric fields in the thyristor and in addition, spin-etching to reduce edge leakage and the possibility of localized surface breakdown during operation. Beveled side surfaces 43 are then coated with a suitable passivating layer 44. Material particularly suitable for this purpose is 1,2-dihydroxyanthraquinone (also called "alizarin") in combination with a silicone or epoxy resin. Passivating layer 44 substantially reduces atmospheric effects on the semiconductor body.

Selective irradiation may thereafter be performed on diode 34 to reduce the current gain of the NPN transistor formed by cathode region 35 of diode 34 and common cathode-base and anode-base regions 25 and 26 at diode 34. First, those portions of first major surface 21 of semiconductor body 20 adjoining main and pilot thyristors 23 and 31 are selectively masked against a radiation means, while leaving exposed those portions of first major surface 21 adjoining diode 34. The selective masking is typically accomplished with a circular shield plate 50 larger than semiconductor body 20, having openings 51 therein corresponding in size and shape to diode 34. Shield plate 50 is mechanically positioned over first major surface 21 of body 20 with openings 51 corresponding to diode 34. Shield plate 50 is of sufficient density and thickness to be opaque to the particular radiation to be used. For electron radiation, shield plate 50 may be of standard, low carbon steel about ¼ inch thick or tungsten or lead about 0.06 inch thick.

After placement of shield plate 50 to selectively mask, diode 34 is selectively irradiated with radiation 52 from a suitable radiation source or means. Any kind of radiation may be appropriate provided it is capable of bombarding and disrupting the atomic lattice of the semiconductor body 20 to create energy levels that substantially increase the carrier recombination rate and decrease carrier lifetime without significantly increasing the carrier generation rate. Electron irradiation is preferably used as a suitable irradiation means because of availability and inexpensiveness. It is contemplated, however, that radiation such as proton, neutron and alpha radiation may be appropriate provided it is of proper intensity and duration. It is further preferred that the energy of electron irradiation be between 1 Mev. and 3 Mev. Lower energies are generally believed to result in substantially elastic collisions with the atomic lattice and, therefore, do not provide enough dislocations within the semiconductor lattice in a commercially feasible time. Conversely, electron radiation above 3 Mev. in energy is believed to cause too severe a lattice damage to the silicon crystal to maintain certain other electrical characteristics of the device within nominal values.

It is further preferred that the radiation dosage of electron radiation be greater than $1 \times 10^{13}$ electrons/cm$^2$ to sufficiently increase the carrier recombination rate and, in turn, decrease the current gain in the common cathode-base region 25 at diode 34. The particular radiation dosage will, of course, vary with the $I_{FB}$, $I_g$ and $I_G$ of the particular device. For the particular thyristor utilized in experimentation with a gate assist current ($I_g$), a radiation dosage level with electron radiation of between 3 and $8 \times 10^{14}$ electrons/cm$^2$ was found to be satisfactory. A current gain of 0.2 was thereby provided, which has been found suitable for a 2 amp gate assist turn-off. On the same device, a 0.1 current gain is anticipated to be appropriate for a 4 amp gate assist turn-off, and 0.4 current gain for a 1 amp gate assist turn-off.

By this selective radiation technique, the main and pilot thyristors are essentially non-irradiated with said radiation means because of the selective masking. "Non-irradiated" in this context may, however, simply mean irradiating to a lower level of irradiation where the electrical characteristics of the device are not adversely effected. Moreover, the "non-irradiated" portions of the devices means radiated to a lower level *for this purpose;* at least some "non-irradiated" portions of the thyristor may and most likely will be selectively irradiated concurrently or sequentially to provide other electrical characteristics to the device.

After irradiation is completed, shield plate 50 is physically removed for reuse and subsequent irradiation.

The operation of the integrated amplifying gate thyristor proceeds by first applying an operating load voltage between anode electrode 37 and cathode electrode 38 across the semiconductor body 20. The applied load voltage is such that the main and pilot thyristors are in a forward high impedance blocking state. A positive current suitable for turn-on of the pilot thyristor is then applied to gate electrode 39. Such gating signal causes a lateral current flow as shown by arrow 25 to forward bias cathode junction 33 of pilot thyristor 31. Forward biasing of cathode junction 33 causes carrier injection into common cathode-base region 25 at pilot thyristor 31, and in turn causes pilot thyristor 31 to switch to a low impedance, conducting state, with anode current shown by arrow 46 flowing from anode electrode 37 into cathode-emitter region 32 of pilot thyristor 31. The anode current in turn flows from the cathode-emitter region 32 into floating electrode 40, common cathode-base region 25 and cathode shunts 25A located along the inner edge of cathode-emitter region 24 of main thyristor 23 to cathode electrode 38, as shown by arrows 47. Although pilot thyristor 31 is disposed in body 20 in annular segments, floating electrode 40 includes an annulus so that the anode current from the pilot thyristor is injected into main thyristor 23 along the entire inner edge of cathode-emitter region 24. The injected anode current from pilot thyristor 31 forward biases the cathode junction 28 of main thyristor 23 and causes carrier injection into common cathode-base region 25 and switching of main thryistor 23 from the high blocking state to a low impedance conducting state with the flow of anode current shown by arrows 48.

To turn-off main thyristor 23 operated in the GATT mode (e.g. under a high frequency AC load potential above 10 KHz), the anode current is commutated to zero leaving a high carrier density in anode-base region 26 of the thyristor adjacent PN junction 29. A negative gate assist current is applied to gate electrode 39 as the forward lead voltage is reapplied to cause a lateral current to flow from cathode electrode 38 through cathode shunts 25A, cathode-base region 25 and diode 34 to gate electrode 39. Such lateral current tends to reverse bias to cathode junction 28, and counteracts the current distribution present in the cathode-base region that tends to forward bias cathode junction 28. The gate assist thereby reduces the likelihood that a reapplied forward voltage will fire the device, and the forward voltage can be reapplied within a shorter time period after commutation of the anode load current to zero—by definition reducing the "turn-off time" of the device.

To turn-off main thyristor 23 operated in the GCS mode (i.e. under a low frequency AC or DC load voltage), a negative gate current is applied to gate electrode 39 while the load voltage remains applied between the anode and cathode electrodes 37 and 38. The negative gate signal forward biases PN junction 36 of diode 34, causing lateral current flow as shown by arrows 49 from cathode electrode 38 through cathode shunts 25A, cathode-base region 25 and diode 34 to gate electrode 39. The voltage on PN junction 28 of main thyristor 23 is reduced to about 0.7 volt and the internal feedback mechanism within the equivalent transistor structures of the main thyristor interrupted. The high impedance blocking state is thus reestablished in main thyristor 23 while the load voltage still remains applied to the device. In this connection, it is seen that the current gain of the NPN transistor formed by diode 34 and common anode-base region 26 at diode 34 must be low to provide for effective gate turn-off. Otherwise, the negative gate signal would cause injection across the common cathode-base region 25 and inhibit turn-off of the main thyristor.

Figure 4:
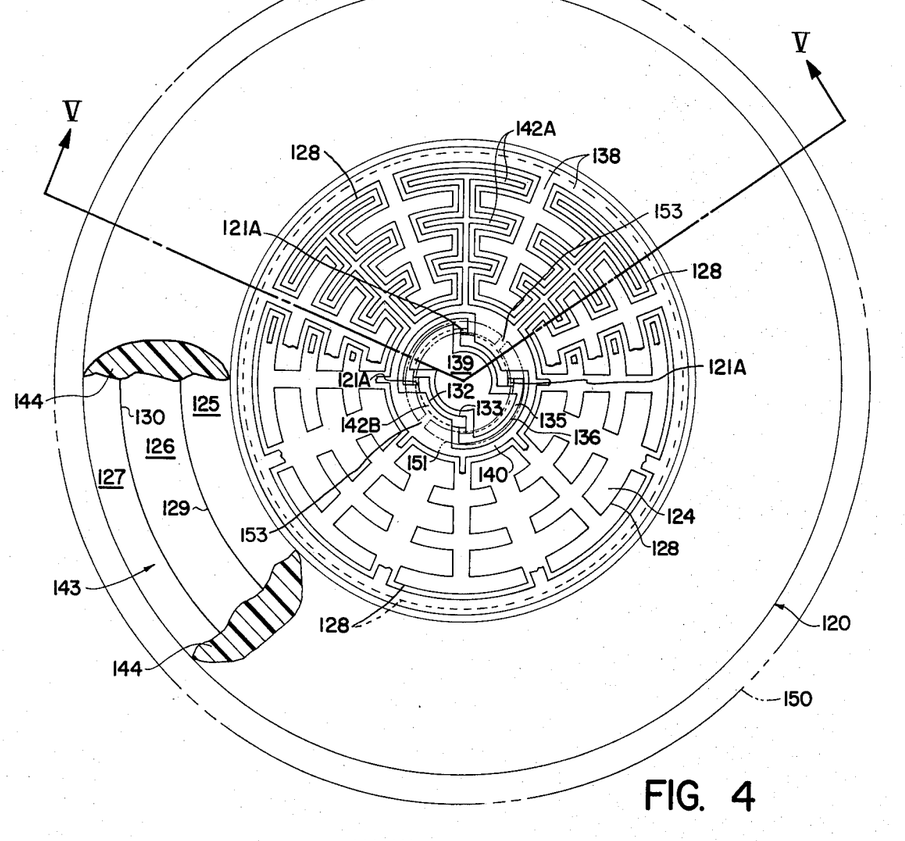
FIG. 4 is a top view, with portions broken away and a suitable irradiation mask shown in chain line, of a second integrated amplifying gate thyristor with gate assist turn-off capability of the present invention.
Figure 5:
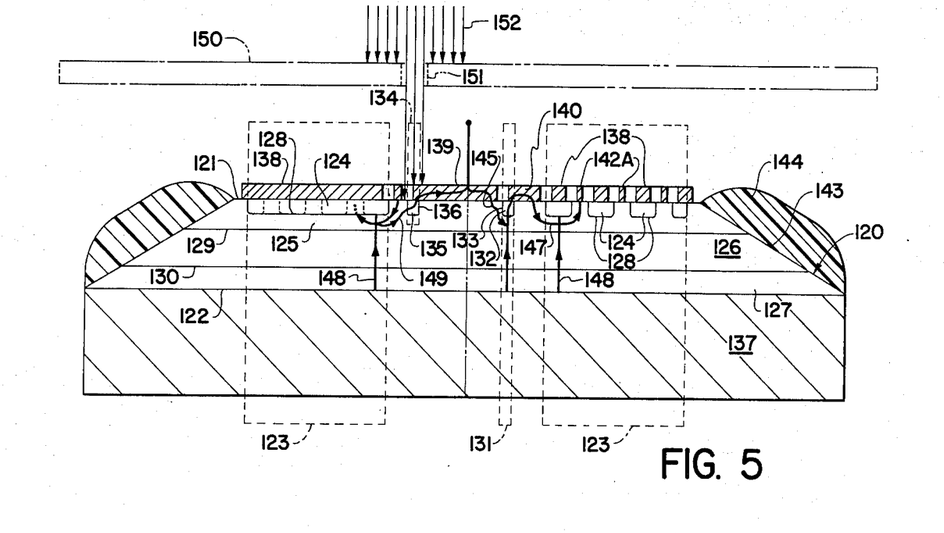
FIG. 5 is a cross-sectional view in elevation taken along lines V—V of FIG. 4.

Referring to FIGS. 4 and 5, an alternative embodiment of the integrated amplifying gate thyristor with gate assist turn-off capability is shown. The structure is the same as that described in connection with FIGS. 2 and 3 except that the annular segments of cathode-emitter region 132 of pilot thyristor 131 and cathode region 135 of diode 134 are radially offset and in turn gate electrode 139 and floating electrode 140 are changed as shown. Accordingly, the elements and features are correspondingly numbered to the embodiment shown in FIGS. 2 and 3, with the prefix "1" before each number.

This embodiment is preferred because it enables the current gain of the NPN transistor structure to be more readily controlled by means complimentary to irradiation as hereinbefore described. Irradiation mask 150 can thus be made with openings 151 forming a complete annulus except for support portions 153, and mask 150 is more easily aligned over the annular segments of diode 134. In this connection, it should be noted that cathode and gate electrodes 138 and 139 are shaped so that the annular segments of pilot thyristor 131 are positioned centrally of the annular segments of diode 134. This relative positioning is important because the pilot thyristor triggers along its inner edge toward gate electrode 139 and the diode injects electrons into common cathode-base region 125 along its outer edge on application of the negative gate-assist turn-off current.

The operation of the integrated amplifying gate thyristor with gate assist turn-off capability shown in FIGS. 4 and 5 is the same as that shown and described in connection with FIGS. 2 and 3 (as shown by the arrows).

Figure 6:
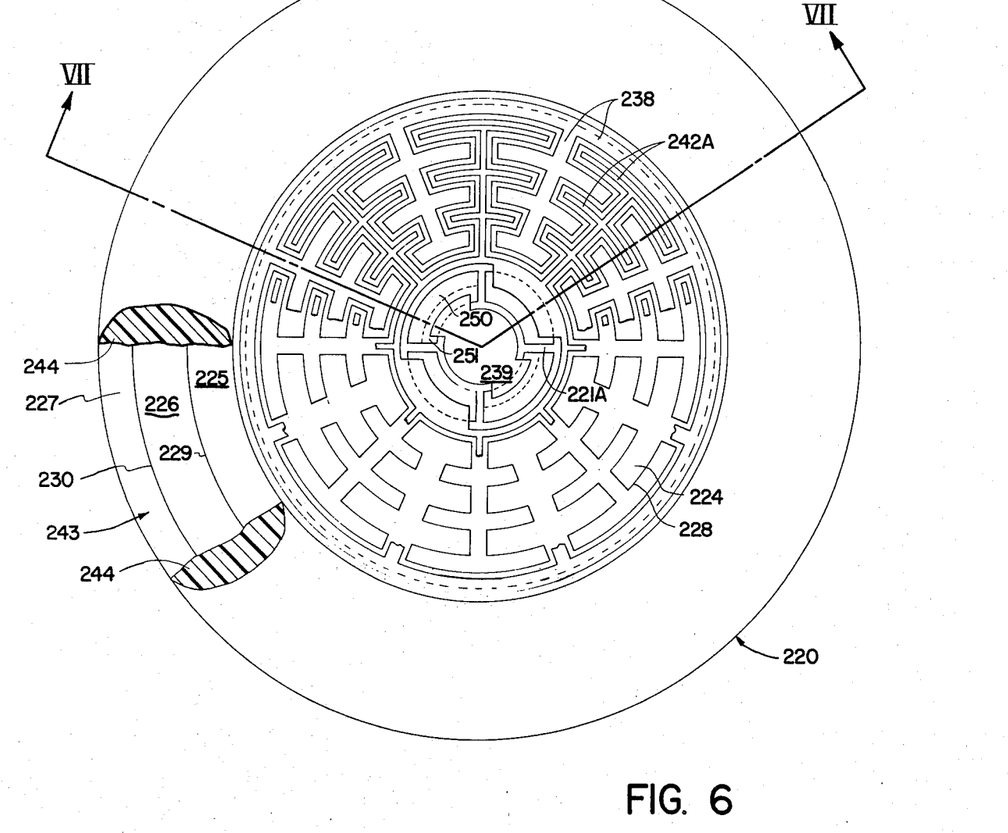
FIG. 6 is a top view, with portions broken away, of a third integrated amplifying gate thyristor with gate assist turn-off capability of the present invention.
Figure 7:
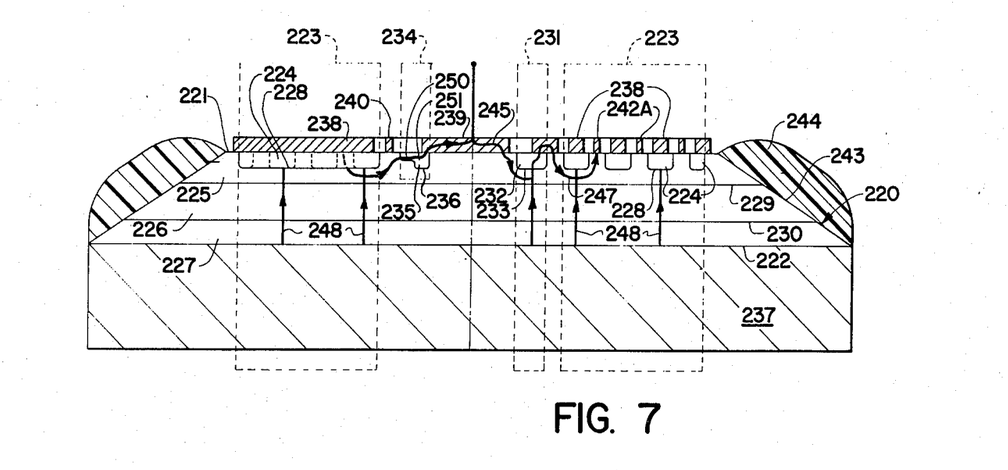
FIG. 7 is a cross-sectional view in elevation taken along lines VII—VII of FIG. 6.
Figure 8:
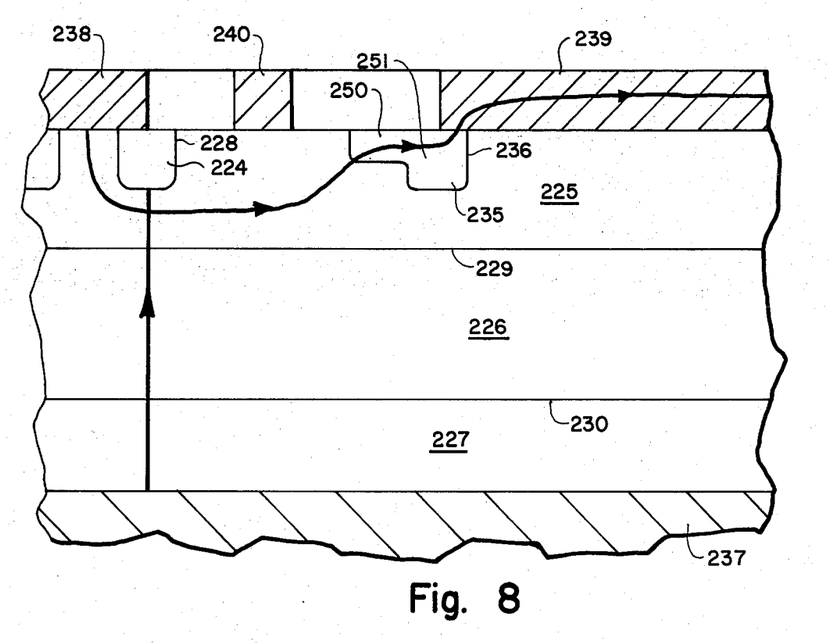
FIG. 8 is an enlarged fragmentary cross-sectional view in elevation of a portion of FIG. 7.

Referring to FIGS. 6, 7 and 8, another integrated amplifying gate thyristor with gate assist turn-off capability of the present invention is shown. All parts are the same as the thyristor described in connection with FIGS. 2 and 3 except for cathode region 235 of diode 234, which is provided with shallow impurity lips 250 toward main thyristor 223. The operation is fundamentally the same as that described in connection with FIGS. 2 and 3. Accordingly, the parts are correspondingly numbered to the elements and features of the thyristor described in connection with FIGS. 2 and 3, with the prefix "2" in front of each number.

Shallow impurity lips 250 are at least as large in area and preferably greater than about twice the area of the deep portions 251 of cathode region 235, and are at least one-half and preferably less than about one-third the depth of the deep portions 251 of cathode region 235. Shallow impurity lips 250 are preferably formed by standard diffusion techniques along with cathode-emitter region 224, cathode-emitter region 232, and deep portions 251 of cathode region 235. The deep diffusion is preferably interrupted to remove additional portions of the diffusion mask corresponding to the areas of first major surface 221 through which lips 250 are to be diffused. This removal of the additional portions of the diffusion mask is accomplished by standard photolithographic and etch techniques. The shallow lips 250 are then diffused through the newly exposed portions of major surface 221, while the diffusion of the deep impurity regions 224, 232 and 235 is completed.

Shallow impurity lips 250 substantially lower the current gain of the NPN transistor structure formed by cathode region 235 of diode 234 and common cathode-base and anode-base regions 235 and 236 at diode 234 by causing electron injection into common cathode-base region 225 to occur in lips 250. Electron injection will initiate at the outer edge of shallow lips 250 and further electron injection will occur over the area of shallow lips 250. Electron injection through the diode is thus forced to occur over a larger area in which the common cathode-base region 225 is wider. In turn, the injection efficiency for electrons into the cathode-base region 225 and the transport factor for electrons through the cathode-base region 225 are reduced. All of this substantially lowers the current gain of the NPN transistor structure at diode 234. The current gain can be further reduced, if need be, by selectively irradiating the diode (including lips 250) as above described in connection with FIGS. 2 and 3 to selectively increase the recombination rate in the common cathode-base region 225 at diode 234.

The use of shallow impurity lips 250 also assists in the efficiency of turn-on of the device by enabling cathode regions 235 of diode 234 to be more deeply diffused without effecting the current gain of the NPN structure at the diode. The lateral resistance through cathode-base region 225 at deep portions 251 of diode 234 can in turn be increased. The lateral current through cathode-base region 225 on turn-on can thus be diverted to flow more under cathode-emitter region 232 of pilot thyristor 231—increasing the efficiency of the gate turn-on current. The amount of wasted gate current by-passing the active element (i.e. pilot thyristor or diode) is reduced in both turn-on and turn-off.

While the presently preferred embodiments of the invention and methods of making them have been specifically described, it is distinctly understood that the invention may be otherwise variously embodied and used within the scope of the following claims. For example, it is readily apparent from the embodiments shown that the pilot thyristor and the diode can be arranged in various configurations depending upon whether turn-off capability or turn-on capability is emphasized. Furthermore, although the N-type and P-type regions are preferably formed by diffusion, epitaxial growth or a combination of epitaxial growth and diffusion, may be utilized in forming the various impurity regions in the semiconductor body. In addition, although it is contemplated that silicon will typically be utilized for the semiconductor body, that other semiconductor materials such as germanium and gallium arsenide may be utilized to achieve specified electrical characteristics for a particular device.

What is claimed is:

1. An integrated amplifying gate thyristor with gate assist turn-off capability comprising:
   A. main and pilot thyristors disposed in a semiconductor body having first and second major surfaces, each thyristor having four impurity regions extending through the body between the major surfaces, said impurity regions of alternate conductivity-type disposed alteratively with PN junctions formed between adjacent regions, the two regions interior being cathode-base and anode-base regions, and the two regions adjoining the first and second major surfaces and adjoining the cathode-base and anode-base regions being cathode-emitter and anode-emitter regions, respectively;
   B. the cathode-base, anode-base and anode-emitter regions of the main and pilot thyristors being common to both thyristors;
   C. said common cathode-base region adjoining the first major surface between the cathode-emitter regions of the main and pilot thyristors such that the cathode-emitter regions thereof are spaced apart:
   D. a diode disposed in the semiconductor body adjacent the main thyristor formed by a cathode impurity region in the body adjoining the first major surface adjacent to and spaced from the separate cathode-emitter regions of the main and pilot thyristors and from the common cathode-base regions of the thyristors, said diode and said cathode-base region at the diode forming a transistor structure having a current gain less than the ratio of $I_{FB}/I_g$, where $I_{FB}$ is the forward anode current triggering the main thyristor into low impedance conducting state by applying a threshold negative gate assist current and an operating anode-cathode load potential, and $I_g$ is a specified gate assist turn-off current to turn-off the main thyristor; and said cathode region of said diode having a shallow impurity lip extending toward the cathode-emitter region of the main thyristor, said shallow lip having an area larger than the remainder of the cathode region and a depth less than about one-half of the remainder of the cathode region:
   E. cathode and anode electrodes positioned on said first and second major surfaces, respectively, to make ohmic contact with the cathode-emitter region of the main thyristor and the common anode-emitter region of the main and pilot thyristors;
   F. a gate electrode positioned on said first major surface to make ohmic contact with the common cathode-base region adjacent to and spaced from the cathode-emitter region of the pilot thyristor, and with the cathode region of the diode; and
   G. a floating electrode positioned on said first major surface adjacent to and spaced from the gate electrode to make ohmic contact with the common cathode-base region between the thyristors and the cathode-emitter region of the pilot thyristor.

2. An integrated amplifying gate thryistor with gate assist turn-off capability as set forth in claim 1 wherein: said cathode region of the diode and said common cathode-base region at the diode are selectively irradiated with a radiation means with said radiation means by masking the thyristors against irradiation, to provide the current gain of the common cathode-base region at the diode less than the ration of $I_{FB}/I_g$.

* * * * *